United States Patent
Ishikawa et al.

(10) Patent No.: US 7,036,453 B2
(45) Date of Patent: May 2, 2006

(54) APPARATUS FOR REDUCING PLASMA CHARGE DAMAGE FOR PLASMA PROCESSES

(75) Inventors: Tetsuya Ishikawa, Santa Clara, CA (US); Alexandros T. Demos, San Ramon, CA (US); Seon-Mee Cho, Santa Clara, CA (US); Feng Gao, Mountain View, CA (US); Kaveh F. Niazi, Santa Clara, CA (US); Michio Aruga, Inba-Gun (JP)

(73) Assignee: Applied Materials, Inc., Santa Clara, CA (US)

( * ) Notice: Subject to any disclaimer, the term of this patent is extended or adjusted under 35 U.S.C. 154(b) by 444 days.

(21) Appl. No.: 10/658,350

(22) Filed: Sep. 8, 2003

(65) Prior Publication Data

US 2004/0048492 A1 Mar. 11, 2004

Related U.S. Application Data

(62) Division of application No. 09/771,203, filed on Jan. 26, 2001, now Pat. No. 6,660,662.

(51) Int. Cl.
*C23C 16/00* (2006.01)

(52) U.S. Cl. .................. 118/723 R; 118/715; 438/787; 438/788

(58) Field of Classification Search ............... 118/715, 118/723 R; 438/787, 788, 680, 681
See application file for complete search history.

(56) References Cited

U.S. PATENT DOCUMENTS

| 5,451,435 | A | | 9/1995 | Yu |
| 5,522,934 | A | | 6/1996 | Suzuki et al. |
| 5,614,055 | A | | 3/1997 | Fairbairn et al. |
| 5,628,869 | A | * | 5/1997 | Mallon ................ 438/694 |
| 6,553,932 | B1 | * | 4/2003 | Liu et al. ................ 118/723 E |
| 2001/0031321 | A1 | | 10/2001 | Ishikawa |
| 2004/0099213 | A1 | * | 5/2004 | Adomaitis et al. ........... 118/715 |

FOREIGN PATENT DOCUMENTS

| WO | WO 99/57747 | | 11/1999 |
| WO | WO 01/03159 A1 | | 1/2001 |

OTHER PUBLICATIONS

Gyeong S. Hwang et al., "Modeling of charging damage during interlevel oxide deposition in high-density plasma," Journal of Applied Physics, vol. 84, No. 1, Jul. 1998, pp. 154–160.

* cited by examiner

*Primary Examiner*—Alexander Ghyka
(74) *Attorney, Agent, or Firm*—Townsend & Townsend & Crew

(57) ABSTRACT

A method is provided for depositing a thin film on a substrate in a process chamber with reduced incidence of plasma charge damage. A process gas containing a precursor gases suitable for forming a plasma is flowed into a process chamber, and a plasma is generated from the process gas to deposit the thin film on the substrate. The precursor gases are flowed into the process chamber such that the thin film is deposited at the center of the substrate more rapidly than at an edge of the substrate.

14 Claims, 16 Drawing Sheets

(2 of 16 Drawing Sheet(s) Filed in Color)

(1)

(2)

(3)

APPARATUS FOR REDUCING PLASMA CHARGE DAMAGE FOR PLASMA PROCESSES

This application is a divisional application of U.S. Patent Application Ser. No. 09/771,203 filed Jan. 26, 2001, now U.S. Pat. No. 6,660,662 the entire disclosure of which is incorporated herein by reference.

BACKGROUND OF THE INVENTION

The present invention relates to the manufacture of integrated circuits on a substrate. More particularly, the invention relates to a method and apparatus for reducing plasma charge damage when such integrated circuits are manufactured using a plasma processing technique.

One of the steps in the fabrication of modern semiconductor devices is the formation of a thin film on a semiconductor substrate by chemical reaction of gases. Such a deposition process is referred to as chemical vapor deposition ("CVD"). Conventional thermal CVD processes supply reactive gases to the substrate surface where heat-induced chemical reactions take place to produce a desired film. Plasma-enhanced CVD techniques, on the other hand, promote excitation and/or dissociation of the reactant gases by the application of radio-frequency ("RF") energy to a reaction zone near the substrate surface, thereby creating a plasma. The high reactivity of the species in the plasma reduces the energy required for a chemical reaction to take place, and thus lowers the temperature required for such CVD processes as compared to conventional thermal CVD processes. These advantages are further exploited by high-density-plasma ("HDP") CVD techniques, in which a dense plasma is formed at low vacuum pressures so that the plasma species are even more reactive.

Any of these CVD techniques may be used to deposit conductive or insulative films during the fabrication of integrated circuits. A common configuration requires deposition of oxide material over a series of metal lines such as shown in FIG. 1(a). In this configuration, metal lines 206 extend in the direction perpendicular to the figure. Each metal line 206 is electrically connected to a gate 208 at a lower level, which is separated from the substrate 202 by a gate oxide 204.

In order to illustrate the charging effects that take place when depositing a film on such a structure, two extreme conditions are considered. The first is illustrated in FIG. 1(b), which shows a highly nonconformal deposition of film 210 over the series of metal lines 206. Such a growth pattern may be termed "neutral-flux-limited oxide growth" and results when the thickness of film 210 increases proportionally to the flux of neutral precursors arriving at a surface segment of the metal-line pattern. The deposited layer 210 is thicker on top of the metal lines 206 than at the bottom of the gaps between them or at the sidewalls. This is a consequence of geometric shadowing of the isotropic neutral precursors by the topography. The second extreme condition is illustrated in FIG. 1(c), which shows conformal deposition of film 210 over the series of metal lines 206. This growth pattern may be described as "reaction-rate-limited oxide growth" and results when the film thickness is independent of the neutral precursor flux. Under such highly idealized conditions, the film surface is the same on all surfaces at all times. Realistic deposition processes behave in a manner intermediate between the extremes illustrated by FIGS. 1(b) and 1(c).

During deposition of oxide material, the metal lines 206 acquire a charge even if initially neutral. Such charging results from a combination of tunneling currents that are generated through the oxide layer at the top and sidewalls, surface currents that are generated along the sidewall and bottom surface, and electron tunneling through the gate oxide from the substrate. FIGS. 1(d) and 1(e) illustrate the currents that are generated during deposition of the oxide layer for neutral-flux-limited growth and reaction-rate-limited growth respectively. The directionality difference between ions and electrons as they cross the forming layer results in a differential charging pattern so that in addition to acquiring a charge, the metal line is subjected to potential gradients.

In particular, electron shading leads to the accumulation of negative charge at the upper sidewalls of the forming layer, while directional ions positively charge the forming surface in the gaps. The combination of a negative potential at the upper sidewall with a positive potential at the gap bottom preferentially deflects less energetic ions towards the sidewall, causing the lower part of the sidewall also to acquire a positive charge. Surface currents ensure that no surface potential gradients larger than a threshold value exist, but large electric fields are generated in the oxide layer, particularly near the top and bottom of the sidewalls where surface potentials approach extreme values.

The oxide field also depends on the metal line potential and the thickness of the oxide layer at each point. It is this thickness dependence that causes deposition of a nonconformal oxide to result in greater metal-line charging and increased gate oxide damage, as shown in FIG. 1(d). In both FIGS. 1(d) and 1(e), positive tunneling currents are illustrated with arrows, the thickness of the arrow being roughly proportional to the size of the current. For nonconformal deposition [FIG. 1(d)], a large positive current flows to the metal line 206 through the sidewall bottom region where the oxide is thinnest. During the early stages of oxide growth, this current is compensated mostly by electron tunneling from the upper sidewall region, with the current through the gate oxide being comparatively smaller. As the oxide thickness at the upper sidewalls increases, there is a corresponding decrease in the electron tunneling current there, forcing the current through the gate oxide to increase to compensate for the excess current flow through the sidewall bottom.

Conversely, during conformal deposition [FIG. 1(e)], the thickness of the film increases at the same rate at the top and bottom of the sidewall as the film is deposited, causing a simultaneous decrease in the positive and negative tunneling currents. Since there is no excess current flow through the sidewall bottom, the compensating current through the gate oxide can remain small. The thickness of the layers in both FIGS. 1(d) and 1(e) has been exaggerated for illustrative purposes; charge damage is caused well before the deposited films reach the thicknesses shown.

This description of the mechanism by which destructive currents are produced during plasma-enhanced CVD is somewhat schematic; a more complete analysis is provided in Gyeong S. Hwang and Konstantinos P. Giapis, J. Appl. Phys. 84, 154 (1998), which is herein incorporated by reference for all purposes. Moreover, while the description has focused on the generation of currents during deposition, similarly destructive currents are generated during plasma-enhanced etching processes. As a result, both deposition and etching processes that use plasma processes to form integrated circuit structures can damage microstructure components by, e.g., causing sidewall irregularities (notching, bowing, etc.) and/or latent gate oxide degradation. Such charging damage is known to be greater for etching higher aspect-ratio structures, where the aspect ratio is the ratio of the height of a gap to its width, and is expected also to be greater for deposition processes on structures with higher aspect ratios. Since efforts are continually being made simultaneously to decrease the critical structural dimensions and to increase the aspect-ratio capacity of such processes as part of the ongoing quest to pack logic devices more densely, it is desirable to have a process by which the charging damage can reduced.

SUMMARY OF THE INVENTION

The disadvantages of the prior art are overcome with a method for reducing plasma discharge damage during plasma deposition processes. By configuring the gas flows to a process chamber such that deposition on a wafer proceeds more rapidly at the center of the wafer than at the edges, the incidence of plasma charge damage is reduced. Accordingly, in one embodiment, a method is provided for depositing a thin film on a substrate in a process chamber. The method comprises flowing a process gas containing a plurality of precursor gases suitable for forming a plasma into the process chamber, and generating a plasma from the process gas to deposit the thin film on the substrate. The precursor gases are flowed into the process chamber such that the thin film is deposited at the center of the substrate more rapidly than at an edge of the substrate.

In particular embodiments, the process chamber includes a top gas source and a side gas source. At least one of the precursor gases is flowed through the top gas source at a higher rate than through the side gas source. In one such embodiment, every precursor gas is flowed through the top gas source at a higher rate than through the side gas source, and in another such embodiment, every precursor gas is flowed only through the top gas source.

The methods of the present invention may be embodied in a computer-readable storage medium having a computer-readable program embodied therein for directing operation of a substrate processing system. Such a system may include a process chamber, a plasma generation system, a substrate holder, a gas delivery system, and a system controller. The computer-readable program includes instructions for operating the substrate processing system to form a thin film on a substrate disposed in the processing chamber in accordance with the embodiments described above.

These and other embodiments of the present invention, as well as its advantages and features, are described in more detail in conjunction with the text below and attached figures.

BRIEF DESCRIPTION OF THE DRAWINGS

The file of this patent contains at least one drawing executed in color. Copies of this patent with color drawings will be provided by the Patent and Trademark Office upon request and payment of the necessary fee.

DESCRIPTION OF THE SPECIFIC EMBODIMENTS

I. Introduction

Fabrication of integrated circuits is typically performed on a circular wafer made of a semiconductor such as silicon. A plurality of rectilinear devices is formed on the wafer as a rectangular array, leaving four similarly shaped circular segments that remain unprocessed. Embodiments of the invention are directed to reducing the possibility of plasma charge damage to such circuits by using a plasma deposition process that begins covering the center of the wafer and works the deposition outwards towards the wafer's edge. The presence of the initial dielectric film at the wafer center prevents destructive charging. In other embodiments, the technique is adapted for etching processes in addition to deposition processes.

II. Exemplary Substrate Processing System

Figure 1A:
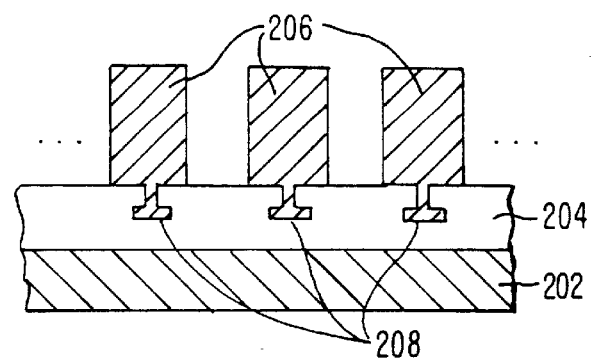
FIG. 1(a) shows a schematic cross-sectional profile of a device structure with several metal lines.
Figure 1B:
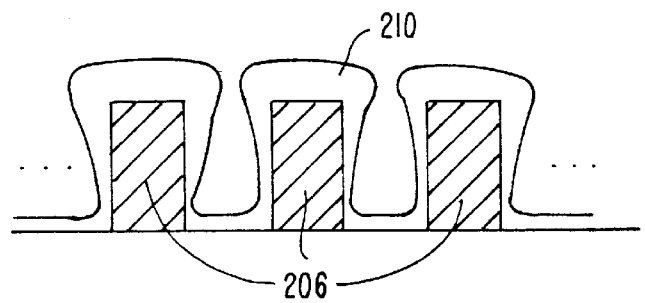
FIG. 1(b) is a cross-sectional profile of a device structure showing nonconformal deposition on metal lines produced by neutral-flux-limited oxide growth.
Figure 1C:
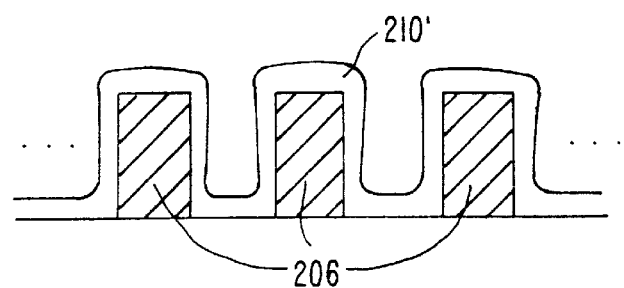
FIG. 1(c) is a cross-sectional profile of a device structure showing conformal deposition on metal lines produced by reaction-rate-limited oxide growth.
Figure 1D:
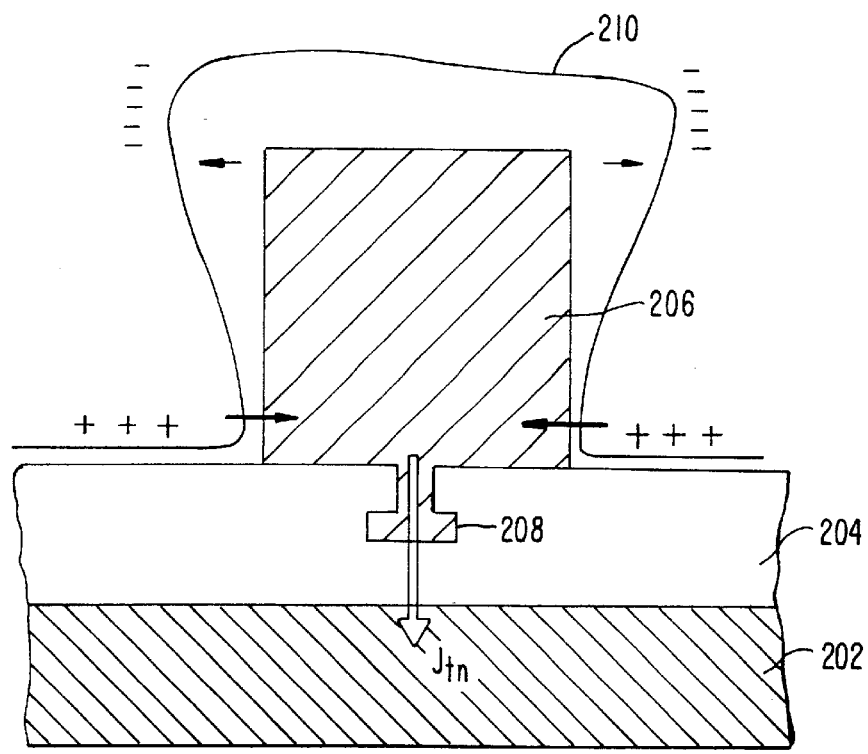
FIG. 1(d) is a cross-sectional profile of a single metal line of a device structure illustrating the tunneling currents induced by nonconformal deposition.
Figure 1E:
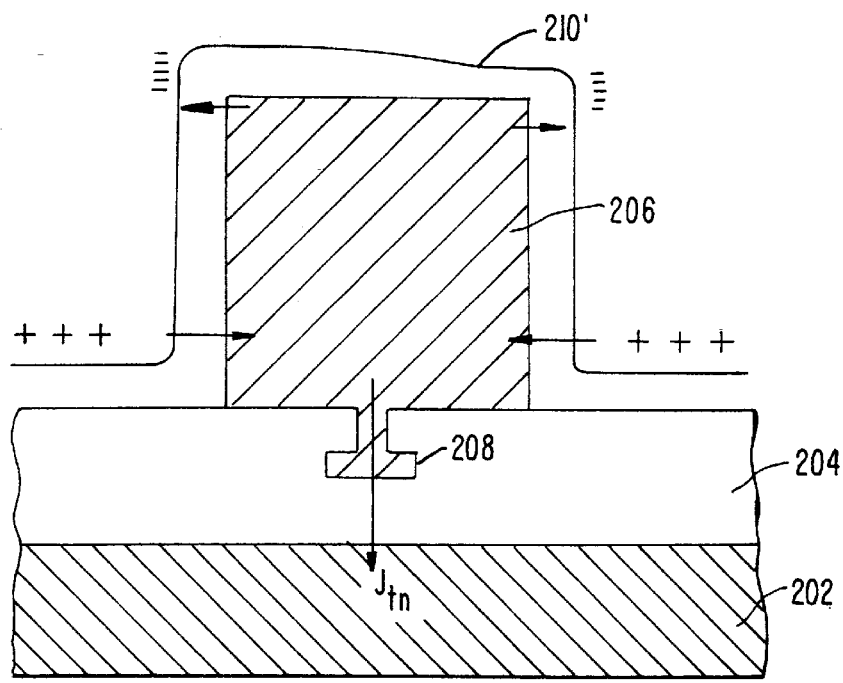
FIG. 1(e) is a cross-sectional profile of a single metal line of a device structure illustrating the tunneling currents induced by conformal deposition.
Figure 2A:
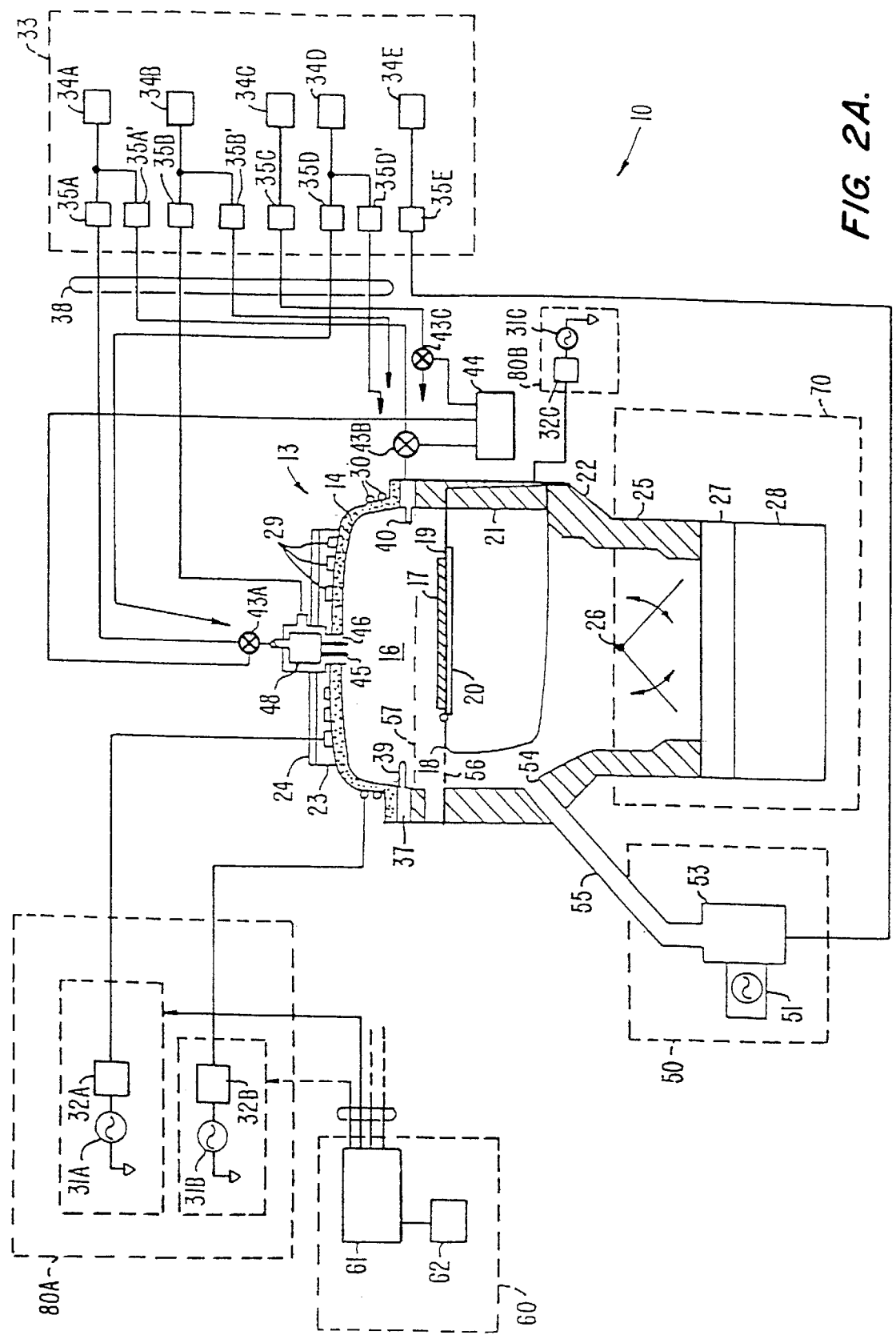
FIG. 2A is a simplified diagram of one embodiment of a high-density plasma chemical vapor deposition system according to the present invention.

FIG. 2A illustrates one embodiment of a high density plasma chemical vapor deposition (HDP-CVD) system 10 in which a dielectric layer according to the present invention can be deposited. System 10 includes a chamber 13, a vacuum system 70, a source plasma system 80A, a bias plasma system 80B, a gas delivery system 33, and a remote plasma cleaning system 50.

The upper portion of chamber 13 includes a dome 14, which is made of a ceramic dielectric material, such as aluminum oxide or aluminum nitride. Dome 14 defines an upper boundary of a plasma processing region 16. Plasma processing region 16 is bounded on the bottom by the upper surface of a substrate 17 and a substrate support member 18.

A heater plate 23 and a cold plate 24 surmount, and are thermally coupled to, dome 14. Heater plate 23 and cold plate 24 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 13 includes a body member 22, which joins the chamber to the vacuum system. A base portion 21 of substrate support member 18 is mounted on, and forms a continuous inner surface with, body member 22. Substrates are transferred into and out of chamber 13 by a robot blade (not shown) through an insertion/removal opening (not shown) in the side of chamber 13. Lift pins (not shown) are raised and then lowered under the control of a motor (also not shown) to move the substrate from the robot blade at an upper loading position 57 to a lower processing position 56 in which the substrate is placed on a substrate-receiving portion 19 of substrate support member 18. Substrate receiving portion 19 includes an electrostatic chuck 20 that secures the substrate to substrate support member 18 during substrate processing. In a preferred embodiment, substrate support member 18 is made from an aluminum oxide or aluminum ceramic material.

Vacuum system 70 includes throttle body 25, which houses twin-blade throttle valve 26 and is attached to gate valve 27 and turbo-molecular pump 28. It should be noted that throttle body 25 offers minimum obstruction to gas flow, and allows symmetric pumping. Gate valve 27 can isolate pump 28 from throttle body 25, and can also control chamber pressure by restricting the exhaust flow capacity when throttle valve 26 is fully open. The arrangement of the throttle valve, gate valve, and turbo-molecular pump allow accurate and stable control of chamber pressures from between about 1 millitorr to about 2 torr.

The source plasma system 80A includes a top coil 29 and side coil 30, mounted on dome 14. A symmetrical ground shield (not shown) reduces electrical coupling between the coils. Top coil 29 is powered by top source RF (SRF) generator 32A, whereas side coil 30 is powered by side SRF generator 32B, allowing independent power levels and frequencies of operation for each coil. This dual coil system allows control of the radial ion density in chamber 13, thereby improving plasma uniformity. Side coil 30 and top coil 29 are typically inductively driven, which does not require a complimentary electrode. In a specific embodiment, the top source RF generator 32A provides up to 2,500 watts of RF power at nominally 2 MHz and the side source RF generator 32B provides up to 5,000 watts of RF power at nominally 2 MHz. The operating frequencies of the top and side RF generators may be offset from the nominal operating frequency (e.g. to 1.7–1.9 MHz and 1.9–2.1 MHz, respectively) to improve plasma-generation efficiency.

A bias plasma system 80B includes a bias RF ("BRF") generator 32C and a bias matching network 32C. The bias plasma system 80B capacitively couples substrate portion 17 to body member 22, which act as complimentary electrodes. The bias plasma system 80B serves to enhance the transport of plasma species (e.g., ions) created by the source plasma system 80A to the surface of the substrate. In a specific embodiment, bias RF generator provides up to 5,000 watts of RF power at 13.56 MHz.

RF generators 32A and 32B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 32A and 32B match the output impedance of generators 32A and 32B with their respective coils 29 and 30. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

Figure 2B:
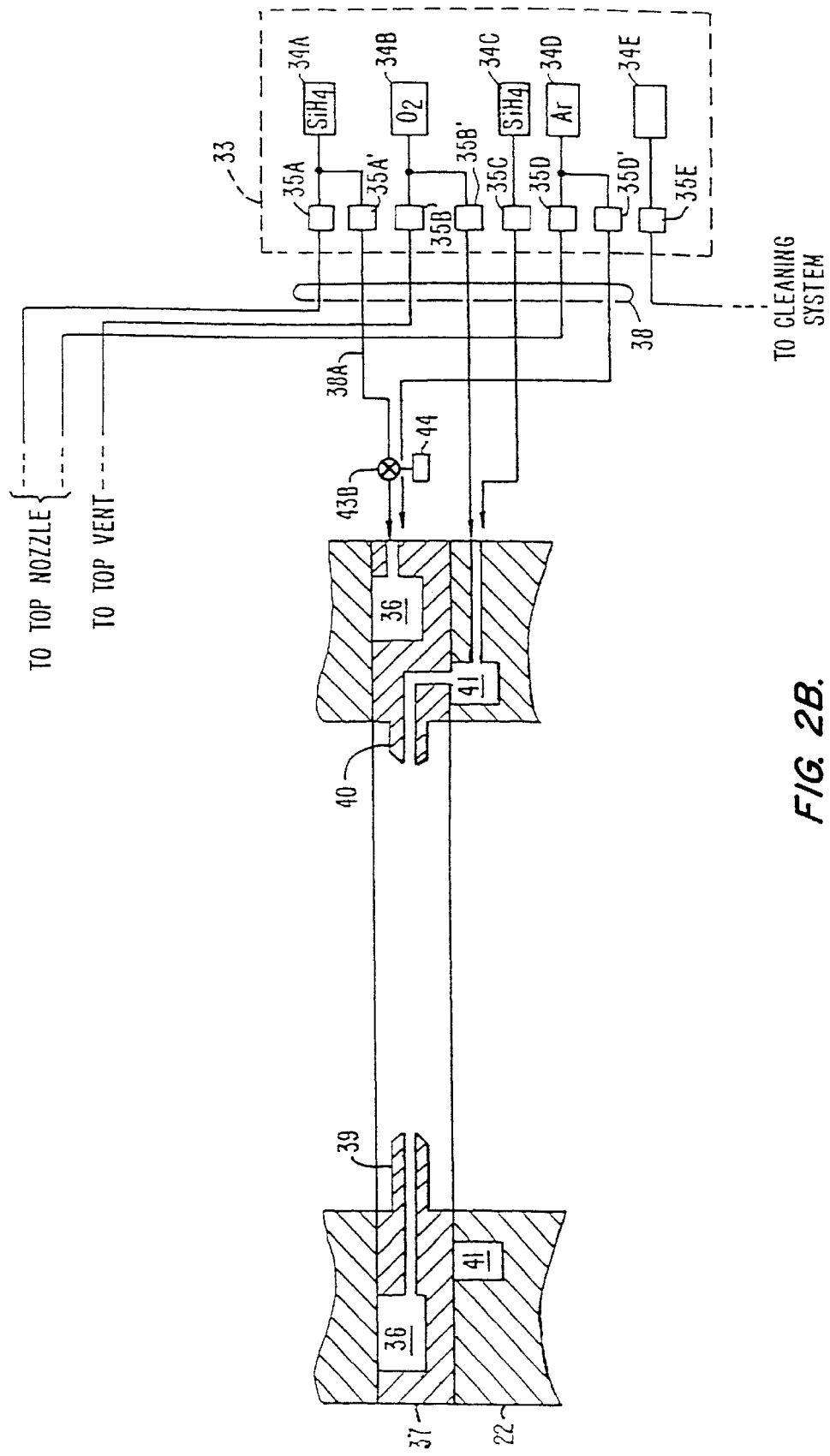
FIG. 2B is a simplified cross section of a gas ring that may be used in conjunction with the exemplary CVD processing chamber of FIG. 2A.

A gas delivery system 33 provides gases from several sources, 34A–34F chamber for processing the substrate via gas delivery lines 38 (only some of which are shown). As would be understood by a person of skill in the art, the actual sources used for sources 34A–34F and the actual connection of delivery lines 38 to chamber 13 varies depending on the deposition and cleaning processes executed within chamber 13. Gases are introduced into chamber 13 through a gas ring 37 and/or a top nozzle 45. FIG. 2B is a simplified, partial cross-sectional view of chamber 13 showing additional details of gas ring 37.

In one embodiment, first and second gas sources, 34A and 34B, and first and second gas flow controllers, 35A' and 35B', provide gas to ring plenum 36 in gas ring 37 via gas delivery lines 38 (only some of which are shown). Gas ring 37 has a plurality of source gas nozzles 39 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In a preferred embodiment, gas ring 37 has 12 source gas nozzles made from an aluminum oxide ceramic.

Gas ring 37 also has a plurality of oxidizer gas nozzles 40 (only one of which is shown), which in a preferred embodiment are co-planar with and shorter than source gas nozzles 39, and in one embodiment receive gas from body plenum 41. In some embodiments it is desirable not to mix source gases and oxidizer gases before injecting the gases into chamber 13. In other embodiments, oxidizer gas and source gas may be mixed prior to injecting the gases into chamber 13 by providing apertures (not shown) between body plenum 41 and gas ring plenum 36. In one embodiment, third and fourth gas sources, 34C and 34D, and third and fourth gas flow controllers, 35C and 35D', provide gas to body plenum via gas delivery lines 38. The nitrogen source 34F provides nitrogen gas ($N_2$) to the oxidizer nozzles of the gas ring to the chamber for process steps utilizing nitrogen plasma. Alternatively, the nitrogen gas could be delivered to the chamber through other or additional inlets, such as the top nozzle. Additional valves, such as 43B (other valves not shown), may shut off gas from the flow controllers to the chamber.

In embodiments where flammable, toxic, or corrosive gases are used, it may be desirable to eliminate gas remaining in the gas delivery lines after a deposition. This may be accomplished using a 3-way valve, such as valve 43B, to isolate chamber 13 from delivery line 38A and to vent delivery line 38A to vacuum foreline 44, for example. As shown in FIG. 2A, other similar valves, such as 43A and 43C, may be incorporated on other gas delivery lines. Such 3-way valves may be placed as close to chamber 13 as practical, to minimize the volume of the unvented gas delivery line (between the 3-way valve and the chamber). Additionally, two-way (on-off) valves (not shown) may be placed between a mass flow controller ("MFC") and the chamber or between a gas source and an MFC.

Referring again to FIG. 2A, chamber 13 also has top nozzle 45 and top vent 46. Top nozzle 45 and top vent 46 allow independent control of top and side flows of the gases, which improves film uniformity and allows fine adjustment of the film's deposition and doping parameters. Top vent 46 is an annular opening around top nozzle 45. In one embodiment, first gas source 34A supplies source gas nozzles 39 and top nozzle 45. Source nozzle MFC 35A' controls the amount of gas delivered to source gas nozzles 39 and top nozzle MFC 35A controls the amount of gas delivered to top gas nozzle 45. Similarly, two MFCs 35B and 35B' may be used to control the flow of oxygen to both top vent 46 and oxidizer gas nozzles 40 from a single source of oxygen, such as source 34B. The gases supplied to top nozzle 45 and top vent 46 may be kept separate prior to flowing the gases into chamber 13, or the gases may be mixed in top plenum 48 before they flow into chamber 13. Separate sources of the same gas may be used to supply various portions of the chamber.

A remote microwave-generated plasma cleaning system 50 is provided to periodically clean deposition residues from chamber components. The cleaning system includes a remote microwave generator 51 that creates a plasma from a cleaning gas source 34E (e.g., molecular fluorine, nitrogen trifluoride, other fluorocarbons or equivalents) in reactor cavity 53. The reactive species resulting from this plasma are conveyed to chamber 13 through cleaning gas feed port 54 via applicator tube 55. The materials used to contain the cleaning plasma (e.g., cavity 53 and applicator tube 55) must be resistant to attack by the plasma. The distance between reactor cavity 53 and feed port 54 should be kept as short as practical, since the concentration of desirable plasma species may decline with distance from reactor cavity 53. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 20, do not need to be covered with a dummy wafer or otherwise protected, as may be required with an in situ plasma cleaning process.

System controller 60 controls the operation of system 10. In a preferred embodiment, controller 60 includes a memory 62, such as a hard disk drive, a floppy disk drive (not shown), and a card rack (not shown) coupled to a processor 61. The card rack may contain a single-board computer (SBC) (not shown), analog and digital input/output boards (not shown), interface boards (not shown), and stepper motor controller boards (not shown). The system controller conforms to the Versa Modular European ("VME") standard, which defines board, card cage, and connector dimensions and types. The VME standard also defines the bus structure as having a 16-bit data bus and 24-bit address bus. System controller 31 operates under the control of a computer program stored on the hard disk drive or through other computer programs, such as programs stored on a removable disk. The computer program dictates, for example, the timing, mixture of gases, RF power levels and other parameters of a particular process. The interface between a user and the system controller is via a monitor, such as a cathode ray tube ("CRT") 65, and a light pen 66, as depicted in FIG. 2C.

Figure 2C:
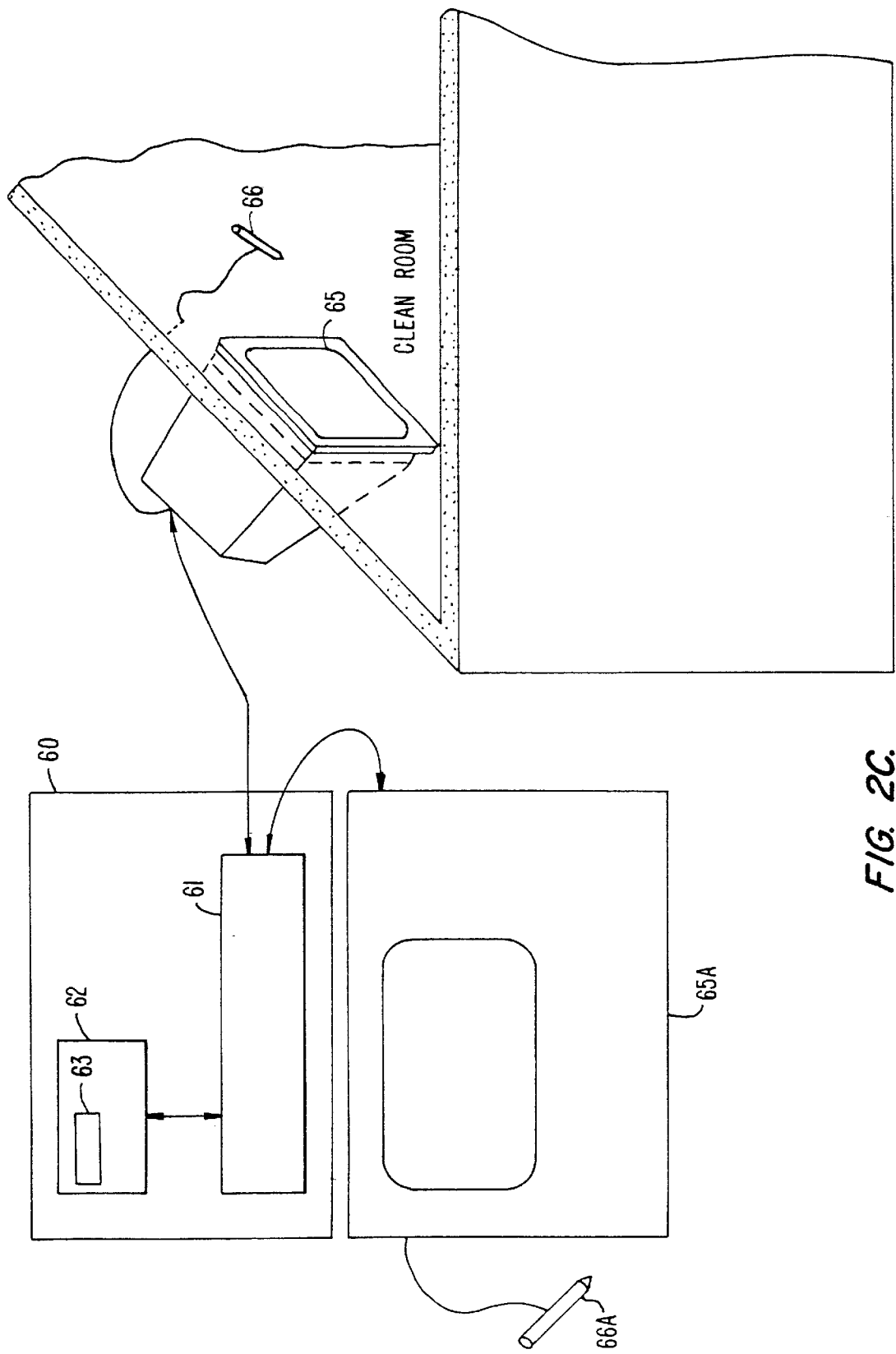
FIG. 2C is a simplified diagram of a monitor and light pen that may be used in conjunction with the exemplary CVD processing chamber of FIG. 2A.

FIG. 2C is an illustration of a portion of an exemplary system user interface used in conjunction with the exemplary CVD processing chamber of FIG. 2A. System controller 60 includes a processor 61 coupled to a computer-readable memory 62. Preferably, memory 62 may be a hard disk drive, but memory 62 may be other kinds of memory, such as ROM, PROM, and others.

System controller 60 operates under the control of a computer program 63 stored in a computer-readable format within memory 62. The computer program dictates the timing, temperatures, gas flows, RF power levels and other parameters of a particular process. The interface between a user and the system controller is via a CRT monitor 65 and a light pen 66, as depicted in FIG. 2C. In a preferred embodiment, two monitors, 65 and 65A, and two light pens, 66 and 66A, are used, one mounted in the clean room wall (65) for the operators and the other behind the wall (65A) for the service technicians. Both monitors simultaneously display the same information, but only one light pen (e.g. 66) is enabled. To select a particular screen or function, the operator touches an area of the display screen and pushes a button (not shown) on the pen. The touched area confirms being selected by the light pen by changing its color or displaying a new menu, for example.

The computer program code can be written in any conventional computer-readable programming language such as 68000 assembly language, C, C++, or Pascal. Suitable program code is entered into a single file, or multiple files, using a conventional text editor and is stored or embodied in a computer-usable medium, such as a memory system of the computer. If the entered code text is in a high level language, the code is compiled, and the resultant compiler code is then linked with an object code of precompiled windows library routines. To execute the linked compiled object code, the system user invokes the object code causing the computer system to load the code in memory. The CPU reads the code from memory and executes the code to perform the tasks identified in the program.

Figure 2D:
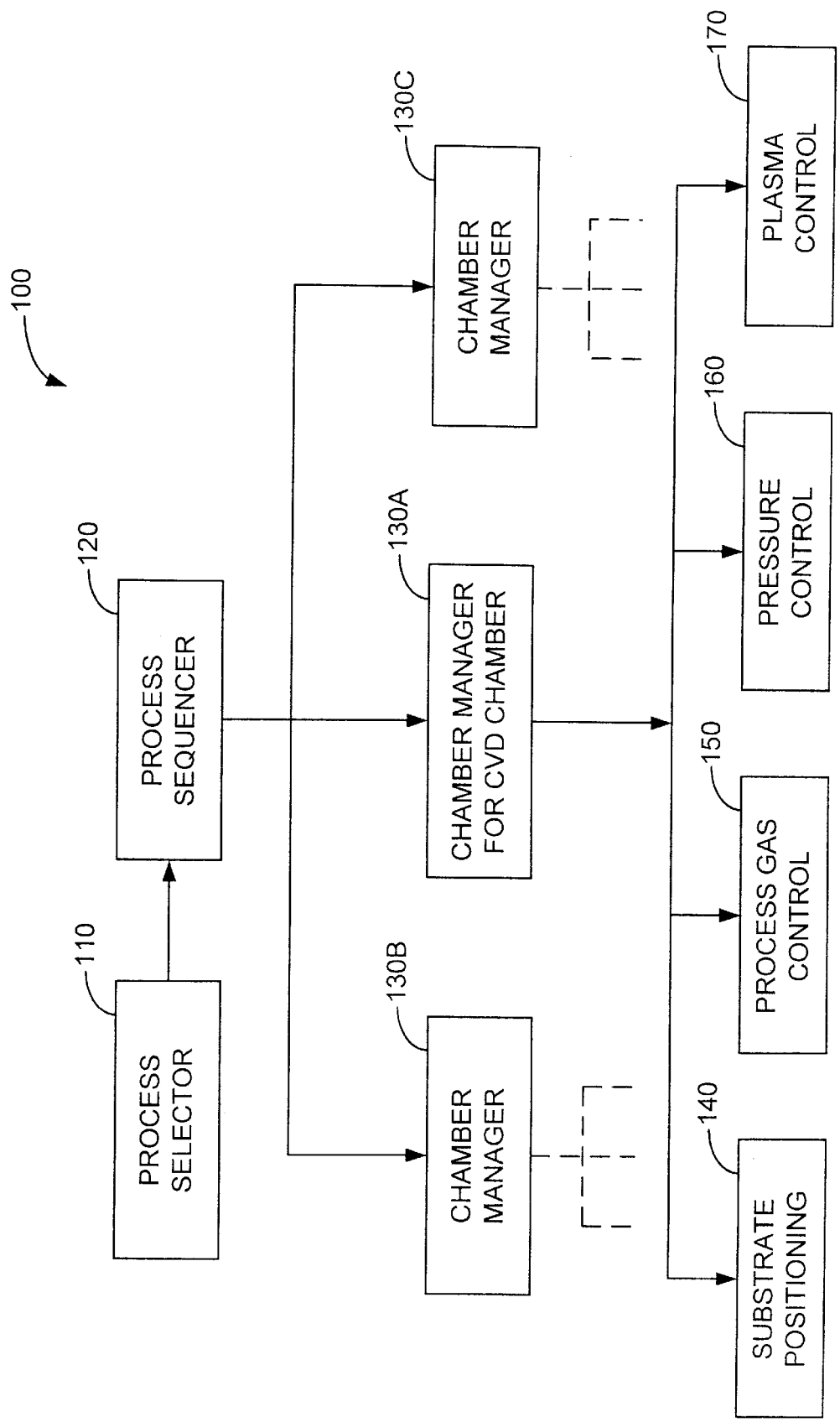
FIG. 2D is a flow chart of an exemplary process control computer program product used to control the exemplary CVD processing chamber of FIG. 2A.

FIG. 2D shows an illustrative block diagram of the hierarchical control structure of computer program 100. A user enters a process set number and process chamber number into a process selector subroutine 110 in response to menus or screens displayed on the CRT monitor by using the light pen interface. The process sets are predetermined sets of process parameters necessary to carry out specified processes, and are identified by predefined set numbers. Process selector subroutine 110 identifies (i) the desired process chamber in a multichamber system, and (ii) the desired set of process parameters needed to operate the process chamber for performing the desired process. The process parameters for performing a specific process relate to conditions such as process gas composition and flow rates, temperature, pressure, plasma conditions such as RF power levels, and chamber dome temperature, and are provided to the user in the form of a recipe. The parameters specified by the recipe are entered utilizing the light pen/CRT monitor interface.

The signals for monitoring the process are provided by the analog and digital input boards of system controller 60, and the signals for controlling the process are output on the analog and digital output boards of system controller 60.

A process sequencer subroutine 120 comprises program code for accepting the identified process chamber and set of process parameters from the process selector subroutine 110 and for controlling operation of the various process chambers. Multiple users can enter process set numbers and process chamber numbers, or a single user can enter multiple process set numbers and process chamber numbers; sequencer subroutine 120 schedules the selected processes in the desired sequence. Preferably, sequencer subroutine 120 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 120 can be designed to take into consideration the "age" of each particular user-entered request, or the present condition of the process chamber being used in comparison with the desired process conditions for a selected process, or any other relevant factor a system programmer desires to include for determining scheduling priorities.

After sequencer subroutine 120 determines which process chamber and process set combination is going to be executed next, sequencer subroutine 120 initiates execution of the process set by passing the particular process set parameters to a chamber manager subroutine 130A–C, which controls multiple processing tasks in chamber 13 and possibly other chambers (not shown) according to the process set sent by sequencer subroutine 120.

Examples of chamber component subroutines are substrate positioning subroutine 340, process gas control subroutine 150, pressure control subroutine 160, and plasma control subroutine 170. Those having ordinary skill in the art will recognize that other chamber control subroutines can be included depending on what processes are selected to be performed in chamber 13. In operation, chamber manager subroutine 130A selectively schedules or calls the process component subroutines in accordance with the particular process set being executed. Chamber manager subroutine 130A schedules process component subroutines in the same manner that sequencer subroutine 120 schedules the process chamber and process set to execute. Typically, chamber manager subroutine 130A includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIGS. 2A and 2D. Substrate positioning subroutine 140 comprises program code for controlling chamber components that are used to load a substrate onto substrate support number 18. Substrate positioning subroutine 140 may also control transfer of a substrate into chamber 13 from, e.g., a plasma-enhanced CVD ("PECVD") reactor or other reactor in the multichamber system, after other processing has been completed.

Process gas control subroutine 150 has program code for controlling process gas composition and flow rates. Subroutine 150 controls the open/close position of the safety shut-off valves and also ramps up/ramps down the mass flow controllers to obtain the desired gas flow rates. All chamber component subroutines, including process gas control subroutine 150, are invoked by chamber manager subroutine 130A. Subroutine 150 receives process parameters from chamber manager subroutine 130A related to the desired gas flow rates.

Typically, process gas control subroutine 150 opens the gas supply lines, and repeatedly (i) reads the necessary mass flow controllers, (ii) compares the readings to the desired flow rates received from chamber manager subroutine 130A, and (iii) adjusts the flow rates of the gas supply lines as necessary. Furthermore, process gas control subroutine 150 may include steps for monitoring the gas flow rates for unsafe rates and for activating the safety shut-off valves when an unsafe condition is detected.

In some processes, an inert gas, such as argon, is flowed into chamber 13 to stabilize the pressure in the chamber before reactive process gases are introduced. For these processes, the process gas control subroutine 150 is programmed to include steps for flowing the inert gas into chamber 13 for an amount of time necessary to stabilize the pressure in the chamber. The steps described above may then be carried out.

Additionally, when a process gas is to be vaporized from a liquid precursor, for example, tetraethylorthosilane (TEOS), the process gas control subroutine 150 may include steps for bubbling a delivery gas such as helium through the liquid precursor in a bubbler assembly or for introducing the helium to a liquid injection valve. For this type of process, the process gas control subroutine 150 regulates the flow of the delivery gas, the pressure in the bubbler, and the bubbler temperature to obtain the desired process gas flow rates. As discussed above, the desired process gas flow rates are transferred to process gas control subroutine 150 as process parameters.

Furthermore, the process gas control subroutine 150 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The process gas control subroutine 150 may also control the flow of heat-transfer gas, such as helium (He), through the inner and outer passages in the wafer chuck with an independent helium control (IHC) subroutine (not shown). The gas flow thermally couples the substrate to the chuck. In a typical process, the wafer is heated by the plasma and the chemical reactions that form the layer, and the He cools the substrate through the chuck, which may be water-cooled. This keeps the substrate below a temperature that may damage preexisting features on the substrate.

Pressure control subroutine 160 includes program code for controlling the pressure in chamber 13 by regulating the size of the opening of throttle valve 26 in the exhaust portion of the chamber. There are at least two basic methods of controlling the chamber with the throttle valve. The first method relies on characterizing the chamber pressure as it relates to, among other things, the total process gas flow, the size of the process chamber, and the pumping capacity. The first method sets throttle valve 26 to a fixed position. Setting throttle valve 26 to a fixed position may eventually result in a steady-state pressure.

Alternatively, the chamber pressure may be measured, with a manometer for example, and the position of throttle valve 26 may be adjusted according to pressure control subroutine 360, assuming the control point is within the boundaries set by gas flows and exhaust capacity. The former method may result in quicker chamber pressure changes, as the measurements, comparisons, and calculations associated with the latter method are not invoked. The former method may be desirable where precise control of the chamber pressure is not required, whereas the latter method may be desirable where an accurate, repeatable, and stable pressure is desired, such as during the deposition of a layer.

When pressure control subroutine 160 is invoked, the desired, or target, pressure level is received as a parameter from chamber manager subroutine 130A. Pressure control subroutine 160 measures the pressure in chamber 13 by reading one or more conventional pressure manometers connected to the chamber; compares the measured value(s) to the target pressure; obtains proportional, integral, and differential (PID) values from a stored pressure table corresponding to the target pressure, and adjusts throttle valve 26 according to the PID values obtained from the pressure table. Alternatively, pressure control subroutine 160 may open or close throttle valve 26 to a particular opening size to regulate the pressure in chamber 13 to a desired pressure or pressure range.

Plasma control subroutine 170 comprises program code for controlling the frequency and power output setting of RF generators 32A and 32B and for tuning matching networks 32A and 32B. Plasma control subroutine 370, like the previously described chamber component subroutines, is invoked by chamber manager subroutine 330A.

An example of a system that may incorporate some or all of the subsystems and routines described above would be the ULTIMA™ system, manufactured by APPLIED MATERIALS, INC., of Santa Clara, Calif., configured to practice the present invention. Further details of such a system are disclosed in the copending, commonly assigned U.S. patent application Ser. No. 08/679,927, filed Jul. 15, 1996, entitled "Symmetric Tunable Inductively-Coupled HDP-CVD Reactor," having Fred C. Redeker, Farhad Moghadam, Hirogi Hanawa, Tetsuya Ishikawa, Dan Maydan, Shijian Li, Brian Lue, Robert Steger, Yaxin Wang, Manus Wong and Ashok Sinha listed as co-inventors, the disclosure of which is incorporated herein by reference. The described system is for exemplary purpose only. It would be a matter of routine skill for a person of skill in the art to select an appropriate conventional substrate processing system and computer control system to implement the present invention.

Figure 2E:
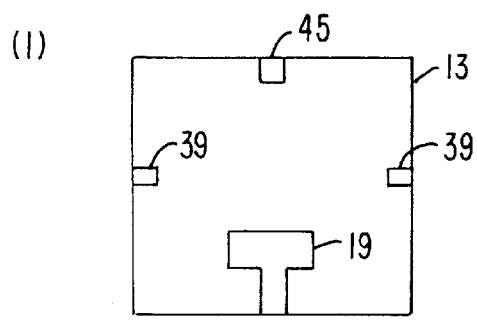
FIG. 2E provides schematic diagrams of examples of various process chamber configurations that may be used with embodiments of the invention.
Figure 2E:
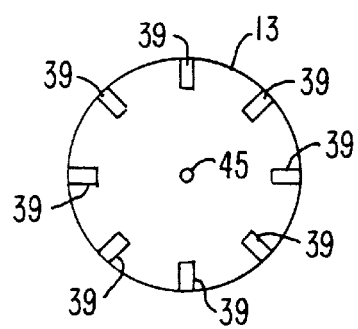
Figure 2E:
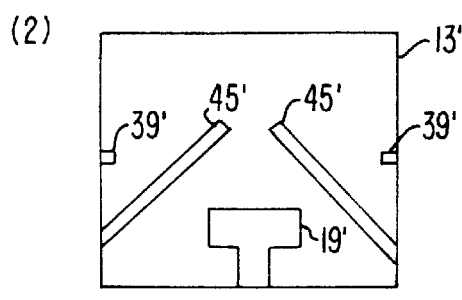
Figure 2E:
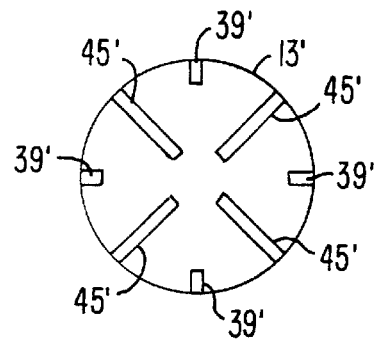
Figure 2E:
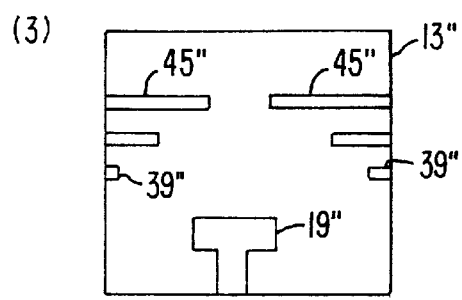
Figure 2E:
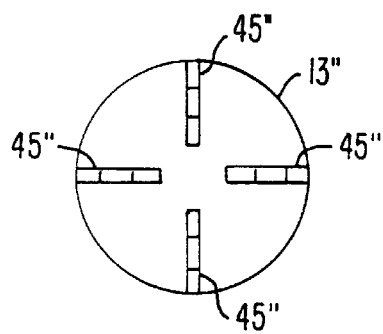

FIG. 2E shows schematically how various different configurations for the processing system may be used in accordance with the invention. The left column of the figure shows a side view of the system while the right column shows a top view. The structure of the system shown in detail in FIG. 2A corresponds to part (1) of FIG. 2E. The chamber 13 includes a substrate receiving portion 19 with gas sources configured so that there are source gas nozzles 39 configured to act as side gas sources and a top nozzle 45 configured to act as a top gas source. As used herein, "top gas source" refers to any gas source configured to provide a supply of gas above the substrate receiving portion and "side gas source" refers to any gas source configured to provide a supply of gas at the periphery of the substrate receiving portion.

Thus, an alternative configuration is shown in part (2) of FIG. 2E, in which the components are denoted with single primes. In this configuration, source gas nozzles 39' within the chamber 13' act as side gas sources because they are configured to provide a supply of gas at the periphery of the substrate receiving portion 19'. Similarly, nozzles 45' act as top gas sources because they provide a supply of gas above the substrate receiving portion 19'. There is no requirement that a top gas source be configured so that the gas supply enter directly from the top of the chamber.

Another alternative configuration is shown in part (3) of FIG. 2E, in which the components are denoted with double primes. In this instance, the side gas sources are provided as nozzles 39" that are shorter and lower in the chamber to provide a supply of gas at the periphery of the substrate receiving portion 19". The top gas sources are provided as parallel nozzles 45" that are longer and higher in the chamber to provide a supply of gas above the substrate receiving portion 19". In this configuration, intermediate nozzles are also provided between the top and side gas sources and may be used to affect the relative flow of gases above and towards the periphery the substrate receiving portion 19".

Numerous other alternative configurations for providing top and side gas sources may occur to those of skill in the art beyond the specific designs that have been illustrated here. The invention may readily be used with such alternative configurations.

III. Exemplary Structures

Figure 3:
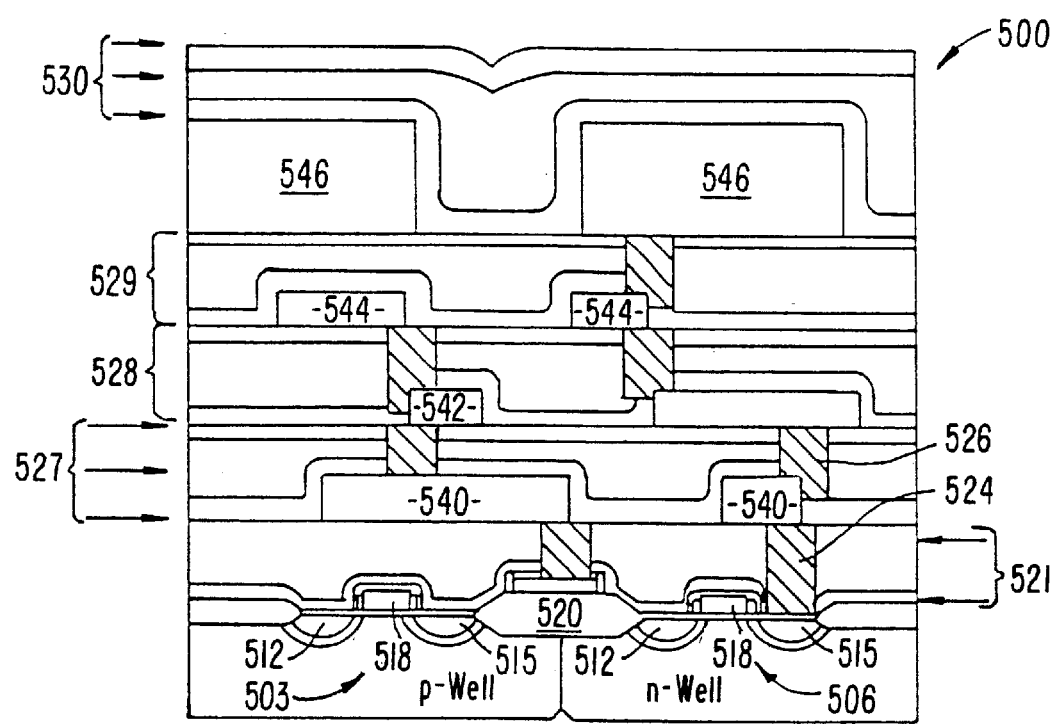
FIG. 3 shows a simplified cross-sectional view of a semiconductor device manufactured according to the method of the present invention.

FIG. 3 illustrates a simplified cross-sectional view of an integrated circuit 500, which may be made in accordance with use of the present invention. As shown, integrated circuit 500 includes NMOS and PMOS transistors 503 and 506, which are separated and electrically isolated from each other by a field oxide region 520 formed by local oxidation of silicon ("LOCOS"), or other technique. Alternatively, transistors 503 and 506 may be separated and electrically isolated from each other by a groove trench isolation (not shown) when transistors 503 and 506 are both NMOS or both PMOS. Each transistor 503 and 506 comprises a source region 512, a drain region 515 and a gate region 518.

A premetal dielectric (PMD) layer 521 separates transistors 503 and 506 from metal layer 540 with connections between metal layer 540 and the transistors made by contacts 524. Metal layer 540 is one of four metal layers, 540, 542, 544, and 546, included in integrated circuit 500. Each metal layer 540, 542, 544, and 546 is separated from adjacent metal layers by respective intermetal dielectric (IMD) layers 527, 528, or 529. Any or all of IMD layers 527, 528, or 529 can be deposited in accordance with embodiments of the present invention. Adjacent metal layers are connected at selected openings by vias 526. Deposited over metal layer 546 are planarized passivation layers 530.

It should be understood that simplified integrated circuit 500 is for illustrative purposes only. One of ordinary skill in the art could implement use of the present invention in relation to fabrication of other integrated circuits such as microprocessors, application specific integrated circuits (ASICs), memory devices, and the like. Further, the present invention may be applied to PMOS, NMOS, CMOS, bipolar, or BiCMOS devices.

IV. Experimental Results

The incidence of plasma charge damage was compared for HDP-CVD deposition of undoped silicate glass (USG) using recipes designed to compare center-fast deposition with edge-fast deposition. The recipes thus include providing $SiH_4$ and $O_2$ to the deposition chamber as precursor gases together with Ar to stabilize the pressure. As will be understood by those of skill in the art, other precursor gases may be used as a source of silicon, such as tetraethylorthosilane (TEOS) or $SiF_4$. Furthermore, the center-fast deposition method may be used to reduce plasma charge damage when depositing other oxides, including fluorinated silicate glass (FSG), by an appropriate selection of precursor gases.

i. Experimental Setup

Figure 4:
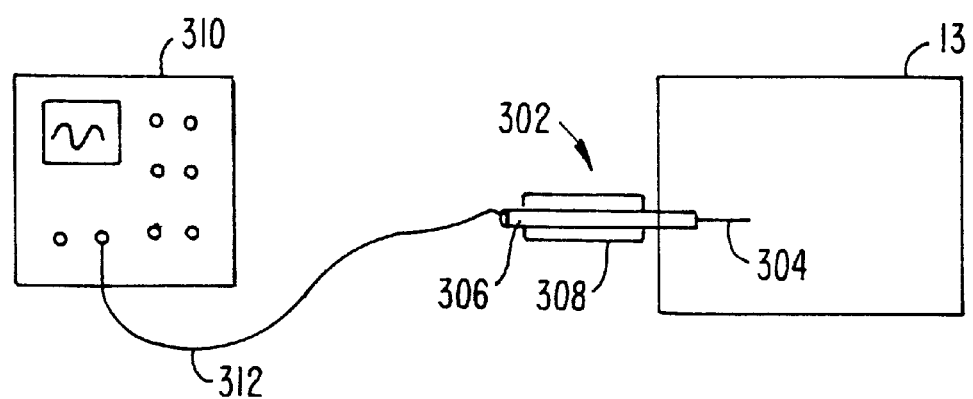
FIG. 4 is a schematic representation of a Langmuir probe configured to measure plasma characteristics in an HDP chamber.

Langmuir probes are commonly used for diagnostic studies of plasmas. A schematic of the Langmuir probe setup is shown in FIG. 4. The Langmuir probe 302 consists of a tungsten wire 304 within a ceramic sheath 306, which is covered by a grounded aluminum tube 308. The probe 302 is inserted into the process chamber 13 to collect measurements, which are transmitted to a plotter 310 over a shielded cable 312. Particular adaptations are needed for use of the Langmuir probe 302 in the deposition environments provided by HDP-CVD chambers because the accumulation of oxide on the tip of the plasma probe 302 causes the formation of a time-dependent capacitive voltage divider that decreases the strength of the probe signal. To accommodate the fact that the probe signal is thus a function of both the plasma potential and the amount of oxide deposited on the probe tip, the wires were cleaned after each deposition by applying a negative bias to the tip in an argon plasma until the ion current thus collected saturated with time. Measurements were then taken by moving the probe 302 to the appropriate position (e.g. the center or edge of the wafer) and the procedure repeated so that measurements were taken consistently with a clean probe.

ii. Edge-Fast and Center-Fast Process Recipes

Two of the process recipes used are summarized in Tables Ia (edge-fast recipe) and Ib (center-fast recipe). In each recipe, eight steps are shown. When two numbers are given in a particular table element, the first number represents the value from side sources (i.e., side coil or side gas source) and the value following the plus sign represents the value from top sources (i.e., top coil or top gas source). The first row shows the length of time that the step conditions were in effect. The second row specifies the position of throttle valve 26: "TCL" means that the throttle valve 26 is closed, "TV100" means that the throttle valve 26 is partially opened by being positioned at 100 steps (corresponding to being approximately 12% open), and "TFO" means that the throttle valve 26 is fully opened. The third and fourth rows respectively specify the source and bias RF power in kW; no bias power is applied in either of these exemplary recipes. The remaining rows specify the flow rate of the gases to the process chamber 13 in sccm. Argon is first introduced to the process chamber 13, followed by molecular oxygen, and finally followed by silane. The edge-fast and center-fast recipes are identical except that in the center-fast recipe, the oxygen and silane flow rates are introduced solely from the top and not the sides in step 7.

TABLE Ia

| | Edge-Fast Recipe | | | | | | | |
|---|---|---|---|---|---|---|---|---|
| Step | 1 | 2 | 3 | 4 | 5 | 6 | 7 | 8 |
| Time (s) | 2 | 15 | 2 | 1 | 1 | 20 | 2 | 6 |
| Press | TCL | TCL | TCL | TV100 | TFO | TFO | TFO | TFO |
| SRF (kW) | 0 | 0 | 1.0 | 1.0 + 2.0 | 1.0 + 2.0 | 1.3 + 2.8 | 1.3 + 3.1 | 1.3 + 3.1 |
| BRF (kW) | 0 | 0 | 0 | 0 | 0 | 0 | 0 | 0 |
| F(Ar) (sccm) | 16 + 180 | 16 + 180 | 16 + 180 | 16 + 110 | 16 + 110 | 16 + 110 | 16 + 110 | 16 + 110 |
| F($O_2$) (sccm) | 0 | 0 | 0 | 0 | 0 + 30 | 16 + 110 | 16 + 110 | 16 + 110 |
| F($SiH_4$) | 0 | 0 | 0 | 0 | 0 | 0 | 3 + 30 | 9 + 53 |

TABLE Ib

Center-Fast Recipe

| Step | 1 | 2 | 3 | 4 | 5 | 6 | 7 | 8 |
|---|---|---|---|---|---|---|---|---|
| Time (s) | 2 | 15 | 2 | 1 | 1 | 20 | 2 | 6 |
| Press | TCL | TCL | TCL | TV100 | TFO | TFO | TFO | TFO |
| SRF (kW) | 0 | 0 | 1.0 | 1.0 + 2.0 | 1.0 + 2.0 | 1.3 + 2.8 | 1.3 + 3.1 | 1.3 + 3.1 |
| BRF (kW) | 0 | 0 | 0 | 0 | 0 | 0 | 0 | 0 |
| F(Ar) (sccm) | 16 + 180 | 16 + 180 | 16 + 180 | 16 + 110 | 16 + 110 | 16 + 110 | 16 + 110 | 16 + 110 |
| F($O_2$) (sccm) | 0 | 0 | 0 | 0 | 0 + 30 | 16 + 110 | 0 + 45 | 16 + 110 |
| F($SiH_4$) | 0 | 0 | 0 | 0 | 0 | 0 | 0 + 25 | 9 + 53 |

Figure 5A:
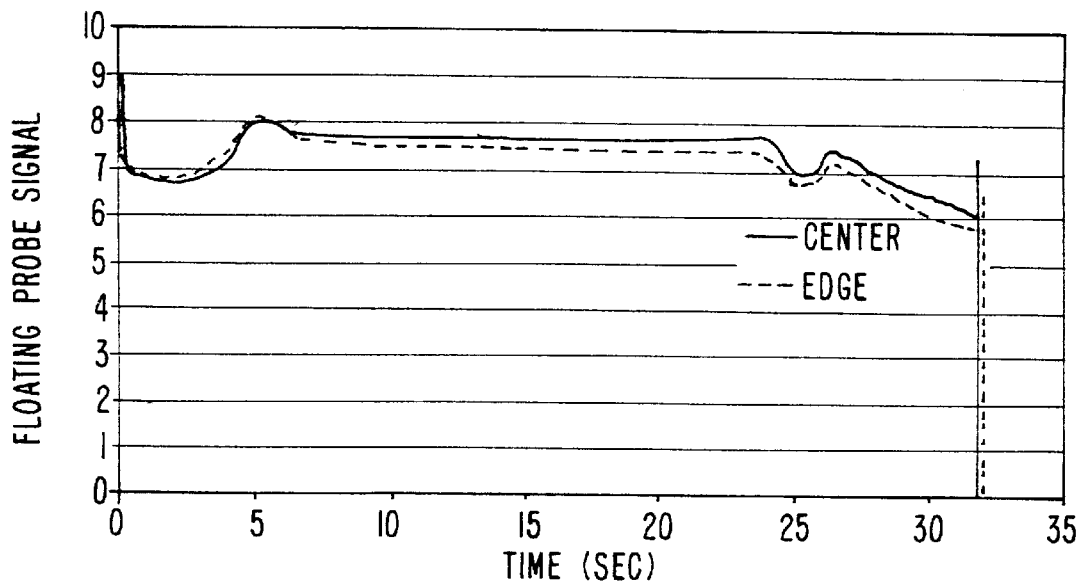
FIG. 5(a) is a graphical comparison of plasma probe signal results for HDP recipes using edge-fast deposition.
Figure 5B:
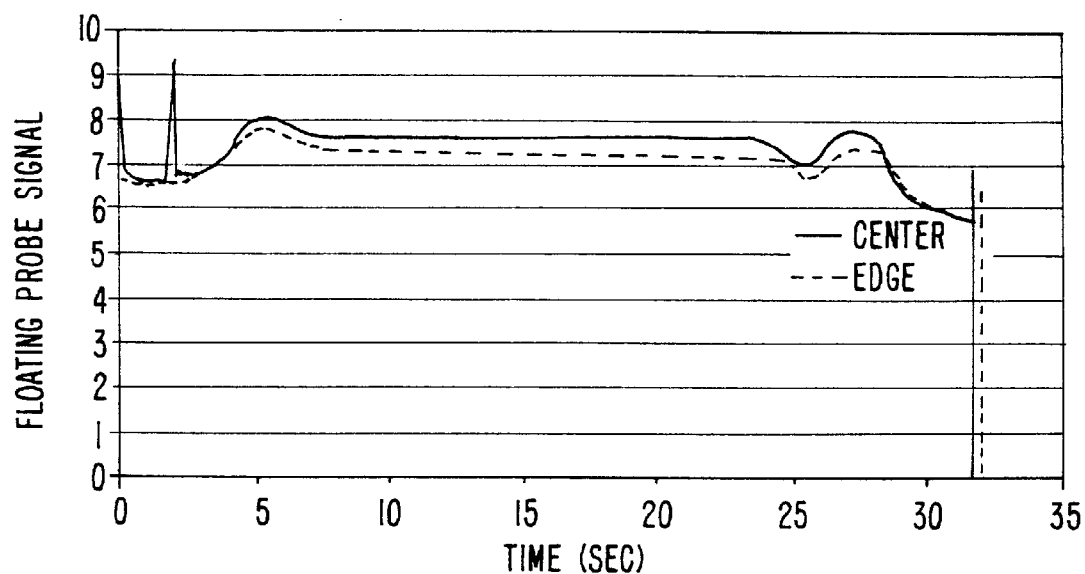
FIG. 5(b) is a graphical comparison of plasma probe signal results for HDP recipes using center-fast deposition.

The characterization of these two recipes as "edge-fast" and "center-fast" is confirmed by plasma probe traces, as shown respectively in FIGS. 5(a) and 5(b). For each recipe, the signal at the edge of the wafer (dashed line) is lower than the center signal (solid line), consistent with chamber-symmetry considerations that dictate the plasma potential be higher at the wafer center than at the edge. The traces show clearly the heat-up start and the subsequent introduction of silane at 24 seconds. The steady monotonic decay of the trace after about 28 seconds is due to oxide coating of the probe. Accurate measures of the plasma fluctuation can be seen prior to this decay, and particularly in the one second period subsequent to the silane introduction when there has been insufficient time for oxide to accumulate on the probe.

FIG. 5(a) shows that the response of the plasma at the wafer center lags that of the plasma at the wafer edge by approximately 0.4 seconds. This behavior is reversed in FIG. 5(b) where the introduction of silane into the chamber first affects the center trace, with the edge trace lagging by approximately 0.6 seconds. Thus, different process recipes may be used to produce the characteristically distinct "edge-fast" and "center-fast" deposition processes. During edge-fast deposition, the disturbance caused by the arrival of silane travels inwards from the edge of the wafer but travels outwards from the center of the wafer when a center-fast recipe is used.

iii. Device-Damage Effects of Edge-Fast and Center-Fast Depositions

Figure 6A:
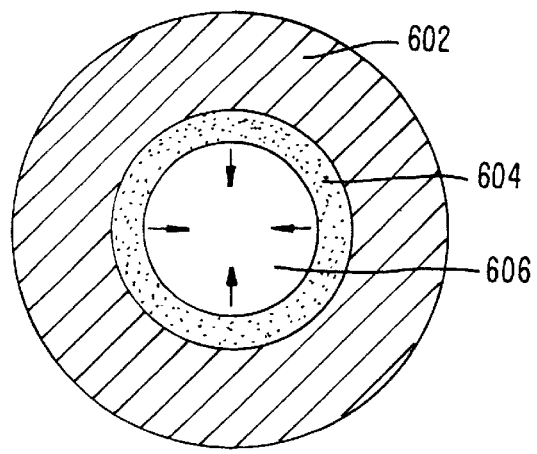
FIG. 6(a) shows a schematic depiction of how edge-fast wafer deposition proceeds.
Figure 6B:
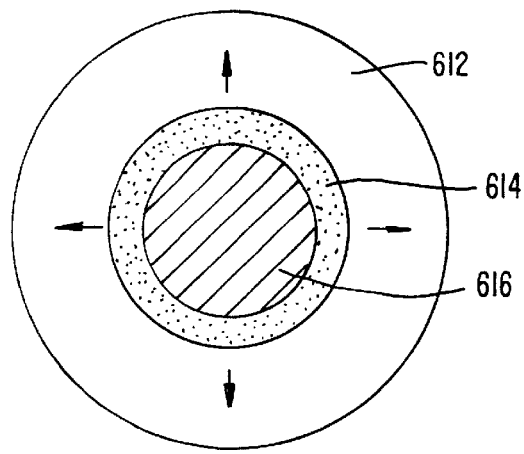
FIG. 6(b) shows a schematic depiction of how center-fast wafer deposition proceeds.
Figure 6C:
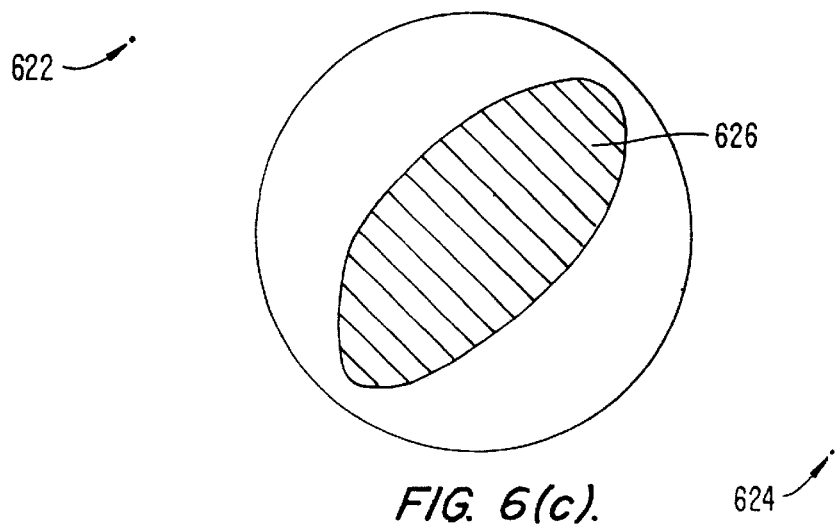
FIG. 6(c) shows the distribution of device damage when edge-fast wafer deposition is used.

The effect on device damage characteristics of the different types of deposition can be understood with reference to FIG. 6. While previous generations of integrated-circuit production techniques have not suffered from insurmountable problems as a result of device damage, the overall device yield may improved with the present invention by reducing the rate of device damage. In FIG. 6(a), a schematic representation of edge-fast deposition is depicted. At the specific time illustrated, material has been deposited on the outer region 602 and has not been deposited on the inner region 606. Annular region 604 represents the leading edge of the deposition process over which considerable variation in thickness is expected. FIG. 6(b) shows the analogous situation at a specific time for center-fast deposition. In this instance, the inner region 616 is covered with material, the outer region 612 is uncovered, and the intermediate annular region 614 is expected to show large thickness variation as the leading deposition edge.

Of note is the fact that the area of the intermediate annular region 604 is a decreasing function of time during edge-fast deposition but the area of the intermediate annular region 614 is an increasing function of time during center-fast deposition. As a result, the current through each gate structure for devices on the circular wafer tends to increase as a function of time for edge-fast deposition but decreases for center-fast deposition. The process of center-fast deposition therefore protects the devices from destructively large currents resulting from the deposition gradients. When side sources 622 and 624 are used, as exemplified in FIG. 6(c), device damage occurs over a roughly elliptical area 626 of the wafer. Since in practice it is impossible to achieve perfectly uniform deposition, the use of center-fast deposition acts to dissipate disturbances arising from the silane-on step over a larger area near the edge of the wafer.

This simple schematic explanation is confirmed by actual measurements using the exemplary edge-fast and center-fast recipes detailed in Tables Ia and Ib. Film-thickness maps are reproduced in FIGS. 7(a) and 7(b) for the center-fast and edge-fast recipes respectively. These graphs show that the initial oxide deposition is a function of the gas flow in the silane-on step. Where top silane and oxygen sources are used exclusively for a portion of the recipe, the deposition pattern is center thick, showing a center-to-edge thickness range of about 450 Å in FIG. 7(a). When both top and side silane sources are used, the thickness variation is smaller, on the order of 100 Å in FIG. 7(b). It is understood that in referring to such thickness variations, they represent thickness variations over a base thickness on the order of 1 μm.

Figure 8A:
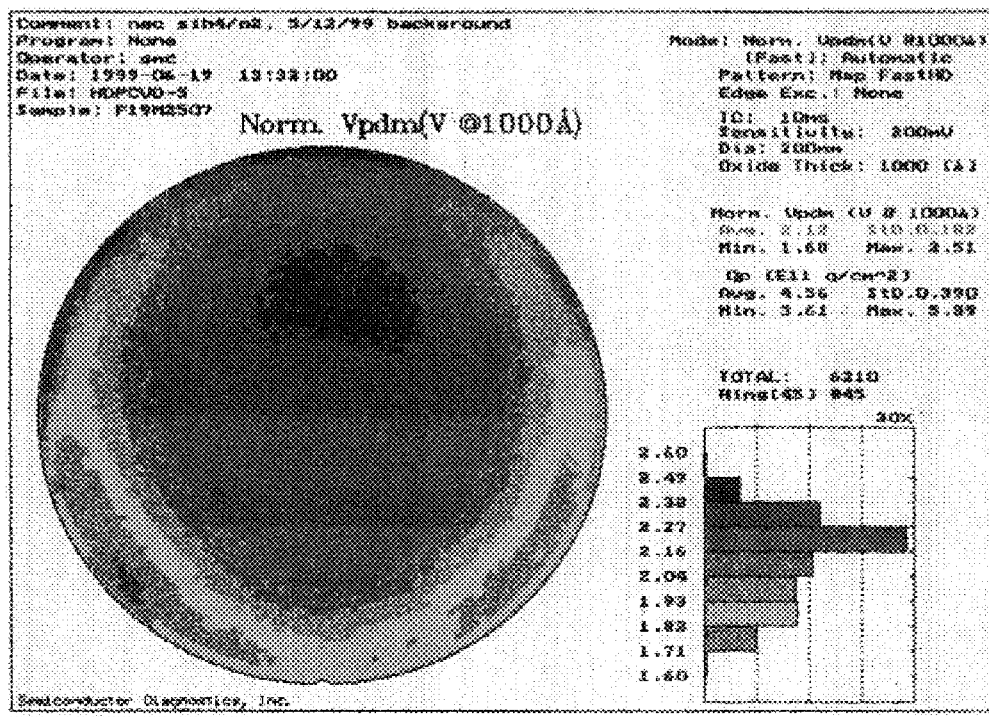
FIG. 8(a) depicts bulk-film plasma-damage-monitoring results for center-fast deposition.
Figure 8B:
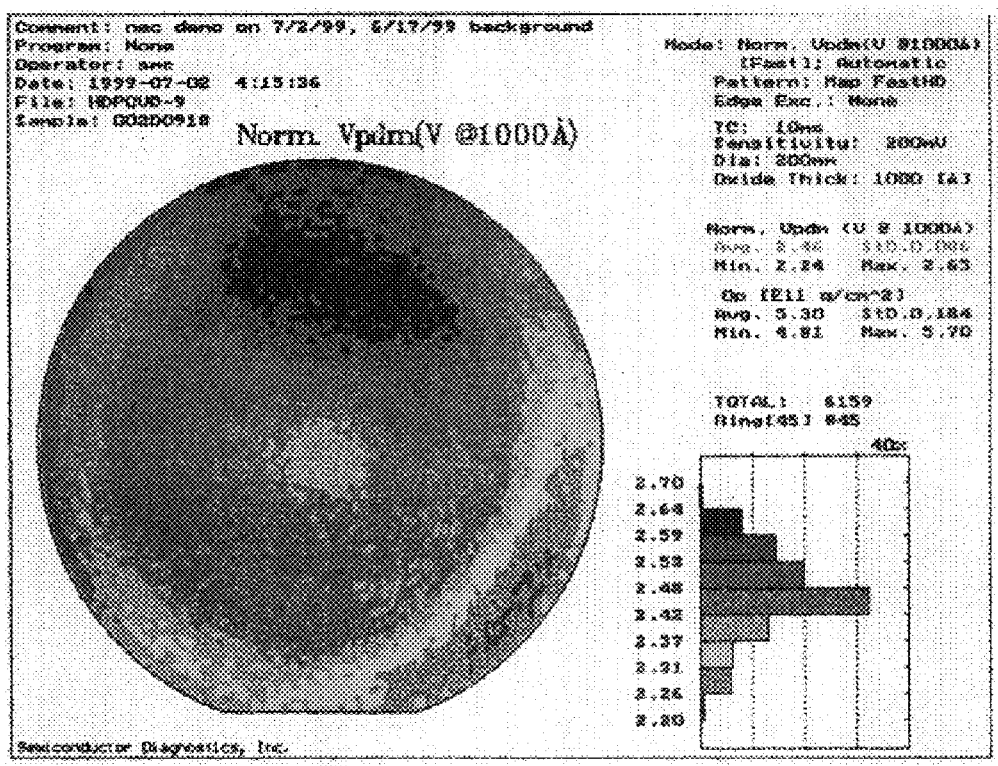
FIG. 8(b) depicts bulk-film plasma-damage-monitoring results for edge-fast deposition.

Results of bulk film plasma damage monitoring ("PDM") are shown in FIGS. 8(a) and 8(b). While PDM is a blanket film-damage test method that does not measure topography-dependent damage mechanisms, it provides information about high surface charge voltages that would produce high interface surface charges. The surface voltage $V_{PDM}$ was measured for the two recipes during the silane-on step, but with a top and side RF power equal to 1.3 kW. As evident in FIG. 8(a), the range of $V_{PDM}$ is approximately 0.41 V when the center-fast recipe is used. The range is more than twice as large, approximately 0.91 V, when the edge-fast recipe is used, as seen from FIG. 8(b). The center-fast recipe thus provides a reduction in surface voltage gradients. The higher surface charge voltage produced by the edge-fast recipe indicates that there is more trapped charge near the center of the wafer than when the center-fast recipe is used.

Figure 9A:
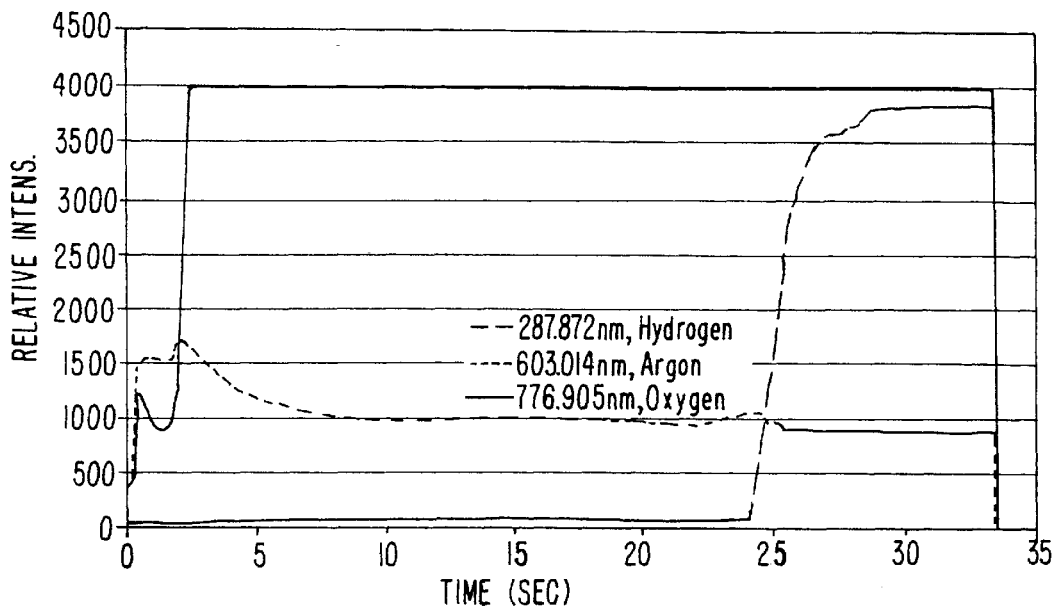
FIG. 9(a) shows the results of optical spectroscopic measurements made over time during edge-fast deposition for the oxygen 777-nm (solid line), hydrogen 288-nm (long-dashed line), and argon 603-nm (short-dashed line) excitation lines.
Figure 9B:
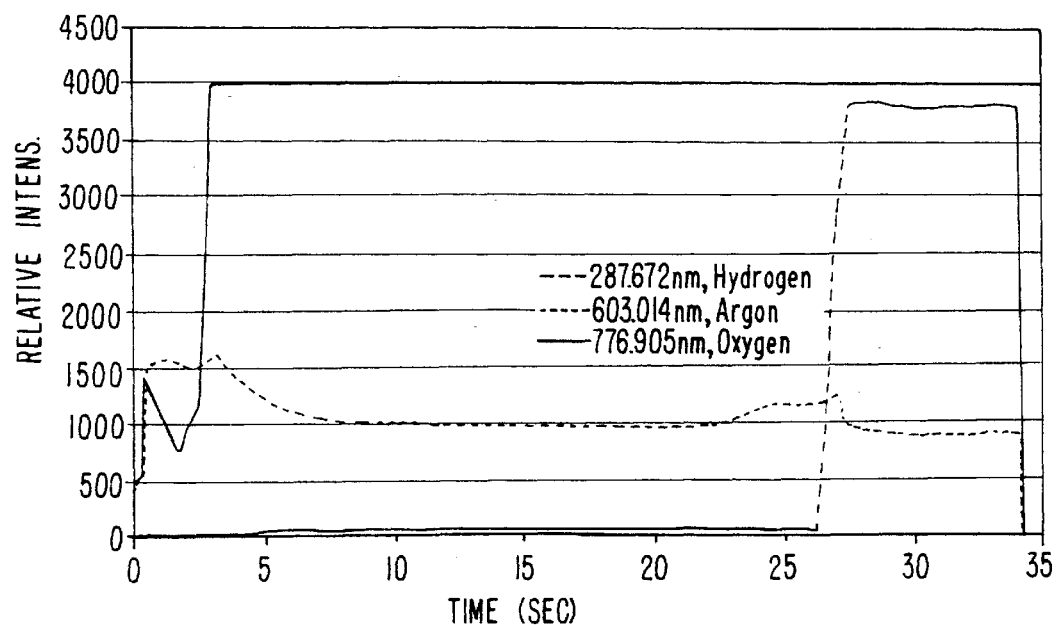
FIG. 9(b) shows the results of optical spectroscopic measurements made over time during center-fast deposition for the oxygen 777-nm (solid line), hydrogen 288-nm (long-dashed line), and argon 603-nm (short-dashed line) excitation lines.

Time-dependent aspects of the deposition are shown in FIGS. 9(a) and 9(b) for the edge-fast and center-fast recipes respectively. Optical measurements were taken with an Ocean Optics 1000 spectrometer to determine the time dependence of silane, oxygen, and argon concentrations. The intensities of three emission lines for hydrogen (288 nm), oxygen (776 nm), and argon (603 nm) were determined as a function of time, the intensity of the hydrogen line being used as an indicator for the presence of silane. In both FIGS. 9(a) and 9(b), the striking of the plasma at time t~0, the introduction of $O_2$, and the introduction of silane are all readily observed. The hydrogen traces allow a comparison of the time taken for hydrogen emission to reach 50% of its final value, which estimates the timescale for diffusion and fragmentation of silane (and the resultant release of hydrogen atoms whose emissions can be detected by the spectrometer). For the edge-fast deposition recipe, this time is approximately 1 s. For the center-fast deposition recipe, the hydrogen trace does not step up until the second silane step when side hydrogen sources are turned on, but reaches 50% of its final value in about half the time. Accordingly, silane is fragmented and diffused more rapidly when the center-fast recipe is used.

Figure 10A:
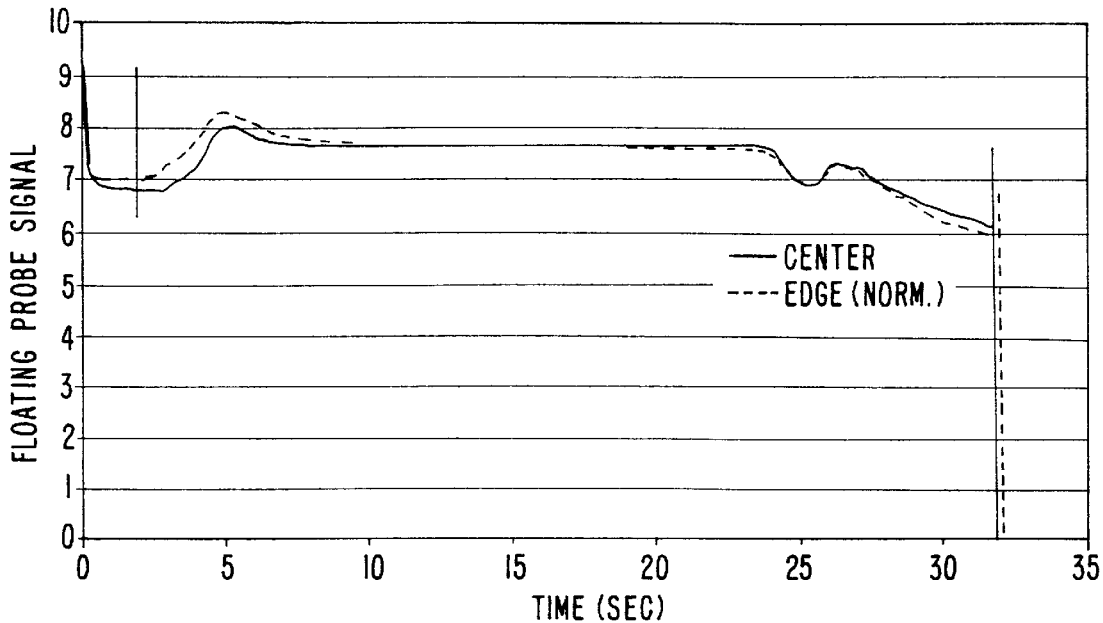
FIG. 10(a) shows the results of plasma-probe measurements taken at the edge and center of a wafer being deposited with edge-fast deposition.
Figure 10B:
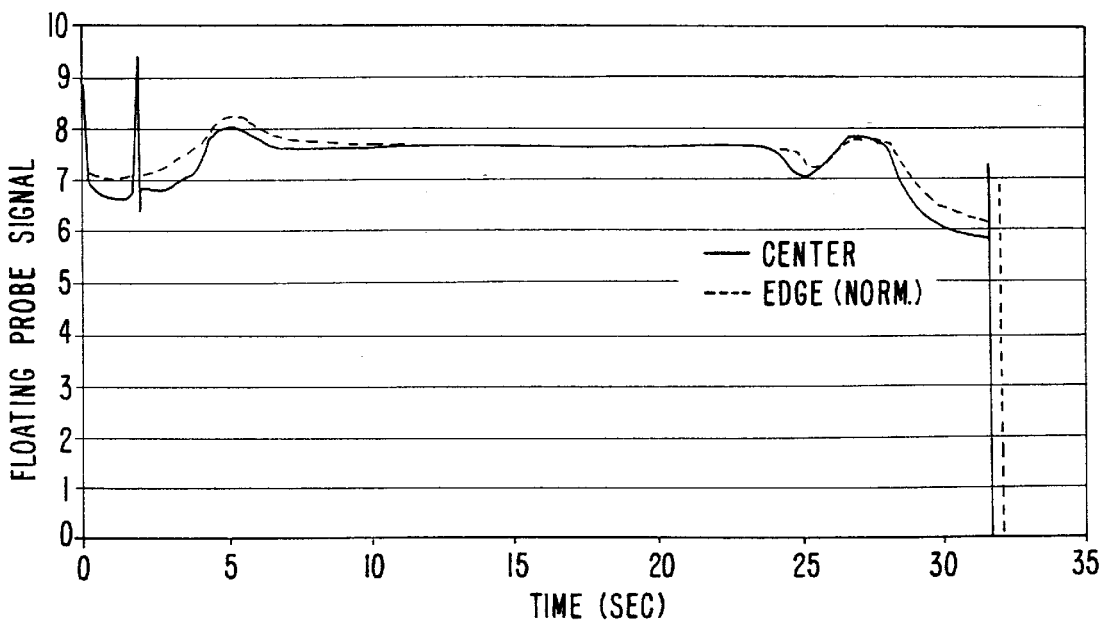
FIG. 10(b) shows the results of plasma-probe measurements taken at the edge and center of a wafer being deposited with center-fast deposition.
Figure 10C:
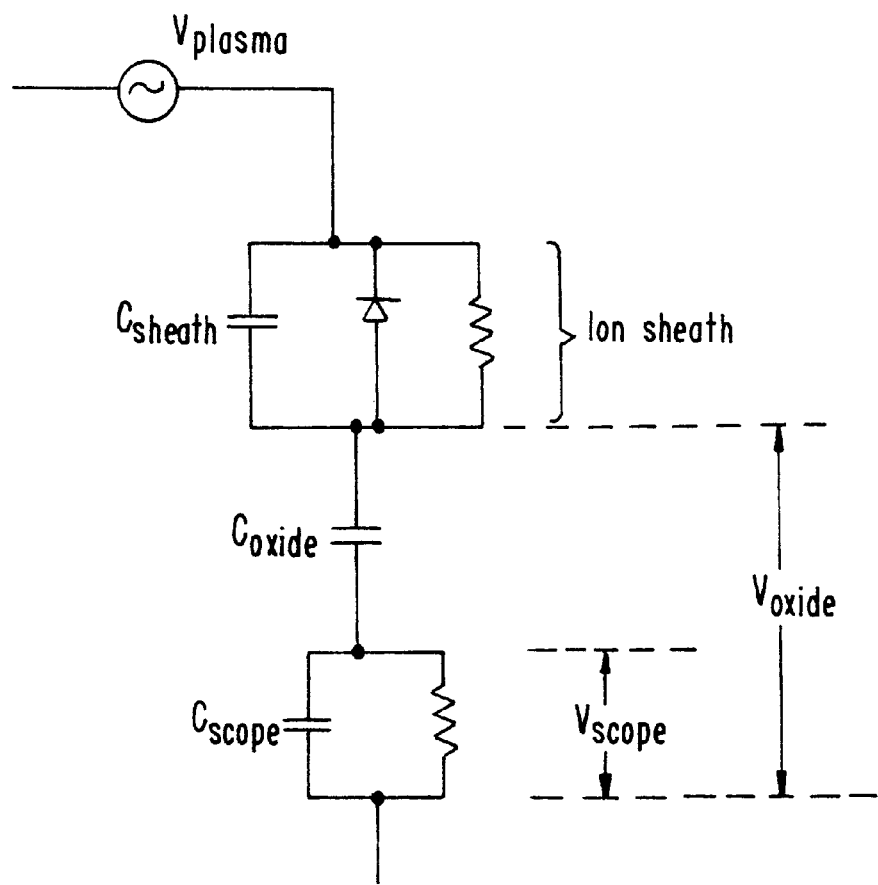
FIG. 10(c) shows a schematic electrical model of oxide deposition characteristics.

The plasma probe signals measured at the edge and center of the wafer are shown in FIGS. 10(a) and 10(b) for the edge-fast and center-fast recipes respectively. For easy comparison purposes, the signals are normalized to the level at their respective heat-up steps. As previously described, the signal level subsequent to the period of transition as the new feed gases diffuse into the chamber is a measure of how much oxide has accumulated on the probe tip. The dependence of the probe voltage to the voltage at the oxide layer can be understood with the model circuit diagram shown in FIG. 10(c). The voltage at the deposited oxide is divided across the oxide capacitance $C_{oxide}$ and the capacitance of the oscilloscope $C_{scope}$:

$$V_{out} = \frac{V_{oxide}}{C_{scope}} \left( \frac{1}{C_{oxide}} + \frac{1}{C_{scope}} \right)^{-1},$$

leading to the result that $V_{out}$ decreases as $C_{oxide}$ decreases. [Note that in the $C_{oxide} \ll C_{scope}$ limit, $V_{out} \sim V_{oxide} C_{oxide}$.] The oxide voltage $V_{oxide}$ is itself related to the plasma potential $V_{plasma}$ through the capacitance of the sheath. Thus, the output of the capacitive probe increases as the thickness of the deposited oxide increases.

Figure 7A:
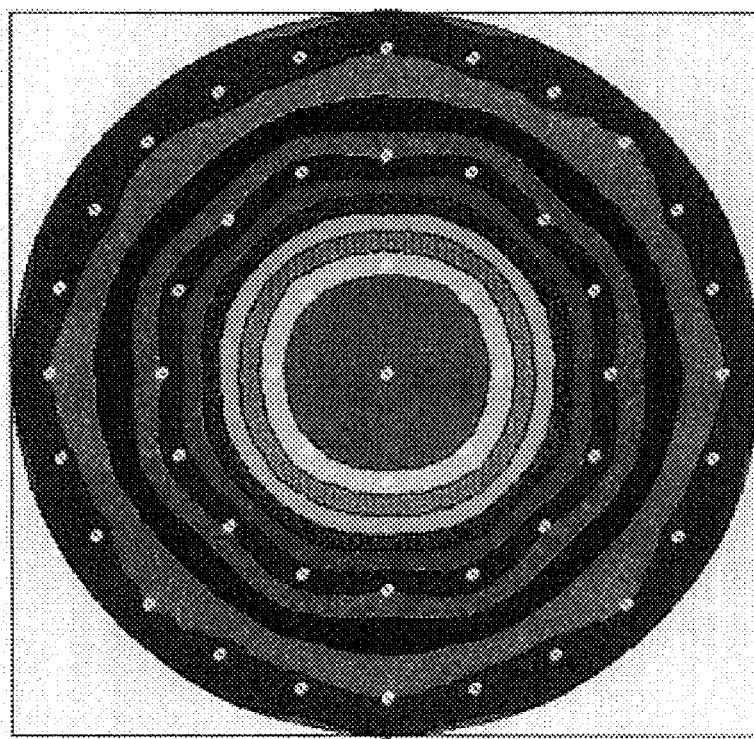
FIG. 7(a) is a contour mapping of the thickness of a film deposited with center-fast deposition.
Figure 7A:
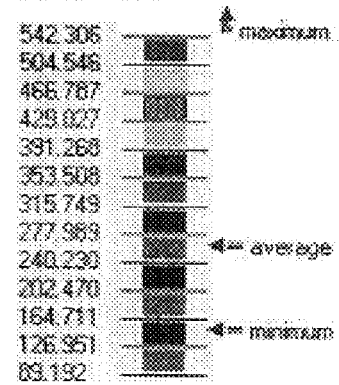
Figure 7B:
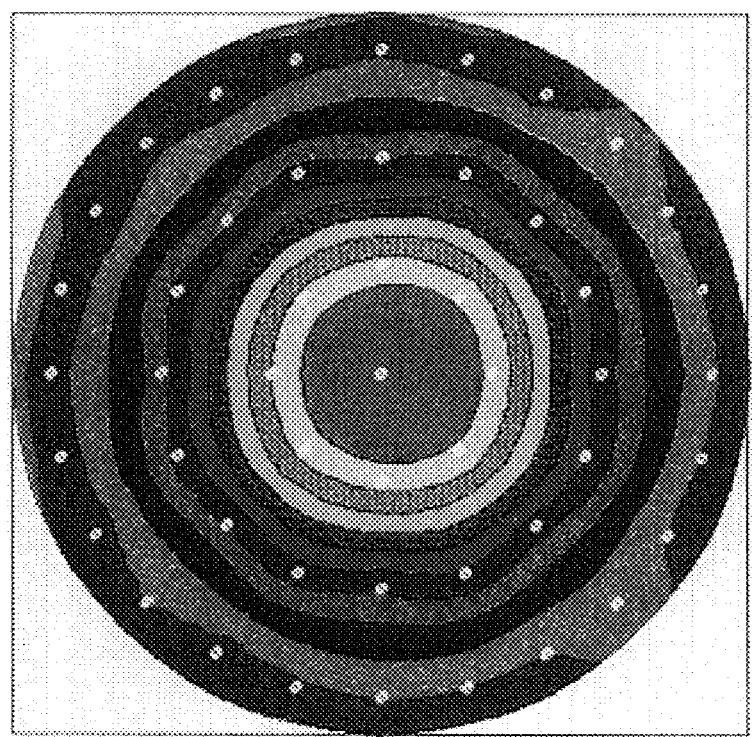
FIG. 7(b) is a contour mapping of the thickness of a film deposited with edge-fast deposition.
Figure 7B:
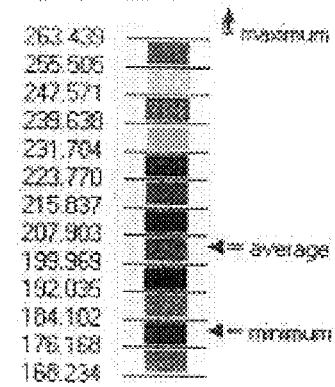

FIG. 10(a) indicates that when the edge-fast deposition recipe is used, the oxide forms uniformly at the wafer edge and in the wafer center. Comparison with FIG. 10(b), which shows a faster signal decay at the center, confirms that the deposition of the center-fast recipe is indeed faster at the center. These results are additionally consistent with the data of FIGS. 7(a) and 7(b) showing that the center-fast recipe produces increased deposition at the center of the wafer.

It is thus apparent that one way to achieve center-fast deposition is to supply precursor gases in one recipe step preferentially to top sources. It is also apparent that such center-fast deposition reduces the level of plasma charge damage when compared with otherwise similar edge-fast deposition recipes. Since the reaction design controls current directionality, center-fast processes may also be used in etching processes.

After reading the above description, other recipes that use center-fast deposition will occur to those of ordinary skill in the art. Other variations will also be apparent without departing from the spirit of the invention. These equivalents and alternatives are intended to be included within the scope of the present invention. Therefore, the scope of this invention should not be limited to the embodiments described, but should instead be defined by the following claims.

What is claimed is:

1. A computer-readable storage medium having a computer-readable program embodied therein for directing operation of a substrate processing system including a process chamber; a plasma generation system; a substrate holder; and a gas delivery system configured to introduce gases into the process chamber, the computer-readable program including instructions for operating the substrate processing system to deposit a thin film on a substrate disposed in the process chamber in accordance with the following:

(a) flowing a process gas comprising a plurality of precursor gases suitable for forming a plasma into the process chamber; and (b) generating a plasma from the process gas to deposit the thin film on the substrate, wherein the plurality of precursor gases are flowed into the process chamber such that the thin film is deposited at a center of the substrate more rapidly than at an edge of the substrate.

2. The computer-readable storage medium according to claim 1 wherein the plurality of constituent reaction gases comprises a silane and a gas that contains oxygen.

3. The computer-readable storage medium according to claim 2 wherein the process gas further comprises an inert gas.

4. The computer-readable storage medium according to claim 1 wherein the process chamber comprises a top gas source and a side gas source, wherein the gas delivery system is configured to introduce gases into the process chamber through the top gas source and the side gas source, and wherein the computer-readable program further includes instructions to flow at least one of such precursor gases through the top gas source at a higher rate than through the side gas source.

5. A substrate processing system comprising:

(a) a housing defining a process chamber;

(b) a high-density plasma generating system operatively coupled to the process chamber;

(c) a substrate holder configured to hold a substrate during substrate processing;

(d) a gas-delivery system configured to introduce gases into the process chamber;

(e) a pressure-control system for maintaining a selected pressure within the process chamber;

(f) a controller for controlling the high-density plasma generating system, the gas-delivery system, and the pressure-control system; and (g) a memory coupled to the controller, the memory comprising a computer-readable medium having a computer-readable program embodied therein for directing operation of the substrate processing system, the computer-readable program including (i) instructions to control the gas-delivery system to flow a process gas comprising a plurality of precursor gases suitable for forming a plasma into the process chamber; and (ii) instructions to control the high-density plasma generating system to generate a plasma from the process gas to deposit a thin film on the substrate, wherein the plurality of precursor gases are to be flowed into the process chamber such that the thin film is deposited at a center of the substrate more rapidly than at an edge of the substrate.

6. The substrate processing system according to claim 5 wherein the plurality of precursor gases comprises a silane and a gas that contains oxygen.

7. The substrate processing system according to claim 6 wherein the process gas further comprises an inert gas.

8. The substrate processing system according to claim 7 wherein the inert gas is argon.

9. The substrate processing system according to claim 5 wherein the gas delivery system is configured to introduce gases into the process chamber through the top gas source and the side gas source, and wherein the computer-readable program further includes instructions to flow at least one of such precursor gases through the top gas source at a higher rate than through the side gas source.

10. The computer-readable storage medium recited in claim 1 wherein the gas delivery system is configured to introduce gases through a top gas nozzle and through a side gas nozzle of the process chamber, the computer-readable program further including instructions for flowing at least one of the precursor gases through the top gas nozzle at a higher rate than through the side gas nozzle.

11. The computer-readable storage medium recited in claim 10 wherein the computer-readable program includes instructions for flowing each of the precursor gases through the top gas nozzle at a higher rate than through the side gas nozzle.

12. The computer-readable storage medium recited in claim 11 wherein the computer-readable program includes instructions for flowing each of the precursor gases only through the top gas nozzle.

13. The substrate processing system recited in claim 9 wherein the computer-readable program includes instructions to flow each of the precursor gases through the top gas nozzle at a higher rate than through the side gas nozzle.

14. The substrate processing system recited in claim 13 wherein the computer readable program includes instructions to flow each of the precursor gases only through the top gas nozzle.

* * * * *